United States Patent
Masano et al.

(12)

(10) Patent No.: US 6,487,456 B1
(45) Date of Patent: Nov. 26, 2002

(54) METHOD AND APPARATUS FOR CREATING A SELECTABLE ELECTRICAL CHARACTERISTIC

(75) Inventors: Thomas Michael Masano, 8400 E. Dixileta #116, Scottsdale, AZ (US) 85262; Roger Jackson, Glendale, AZ (US)

(73) Assignee: Thomas Michael Masano, Scottsdale, AZ (US)

( * ) Notice: Subject to any disclaimer, the term of this patent is extended or adjusted under 35 U.S.C. 154(b) by 0 days.

(21) Appl. No.: 09/502,805

(22) Filed: Feb. 11, 2000

(51) Int. Cl.$^7$ .............................................. G05B 11/01
(52) U.S. Cl. ............................. 700/11; 700/12; 700/13; 700/15; 700/16; 700/293; 712/11; 712/12; 714/10; 714/11; 455/12.1; 455/13.3; 326/37; 326/47; 326/82
(58) Field of Search ................................ 700/11, 12, 13, 700/14, 15, 16, 17, 293; 712/11, 12; 714/10, 11; 455/12.1, 13.3; 326/37, 47, 82

(56) References Cited

U.S. PATENT DOCUMENTS

| | | | | |
|---|---|---|---|---|
| 4,227,172 A | | 10/1980 | Sherman | 338/123 |
| 4,591,740 A | * | 5/1986 | Anderson et al. | 327/378 |
| 4,782,460 A | | 11/1988 | Spencer | 706/39 |
| 4,849,903 A | | 7/1989 | Fletcher et al. | 709/65 |
| 4,965,560 A | * | 10/1990 | Riley | 345/1.1 |
| 5,045,832 A | | 9/1991 | Tam | 338/334 |
| 5,185,708 A | * | 2/1993 | Hall et al. | 340/3.4 |
| 5,216,589 A | * | 6/1993 | Shinnaka | 340/7.27 |
| 5,248,956 A | | 9/1993 | Himes et al. | 338/334 |
| 5,269,002 A | | 12/1993 | Bourgouin et al. | 711/109 |
| 5,441,049 A | | 8/1995 | Masano | 600/345 |
| 5,535,413 A | * | 7/1996 | Ishikawa et al. | 345/502 |
| 5,594,408 A | | 1/1997 | Ezell | 338/89 |
| 5,786,996 A | * | 7/1998 | Vitkus et al. | 219/413 |
| 5,859,718 A | * | 1/1999 | Yamamoto et al. | 359/121 |
| 6,118,829 A | * | 9/2000 | North | 375/316 |
| 6,119,048 A | * | 9/2000 | Kondo et al. | 340/825.63 |
| 6,225,825 B1 | * | 5/2001 | Hopsecger | 326/37 |
| 6,281,606 B1 | * | 8/2001 | Westlake | 307/125 |

* cited by examiner

Primary Examiner—Ramesh Patel
(74) Attorney, Agent, or Firm—Snell & Wilmer L.L.P.

(57) ABSTRACT

A device having a variable output electrical characteristic includes first and second output terminals and a number of switching circuits, each switching circuit having two states. One of the states produces a first electrical effect (such as an increased resistance) between the first and second output terminals, and the other state produces a second electrical effect (such as no change in resistance) between the first and second output terminals. A processor generates control signals that are applied to the switching circuits to place the switching circuits into a desired state such that the variable output characteristic between the first and second terminals is set to a desired value, which may be input from a user.

55 Claims, 7 Drawing Sheets

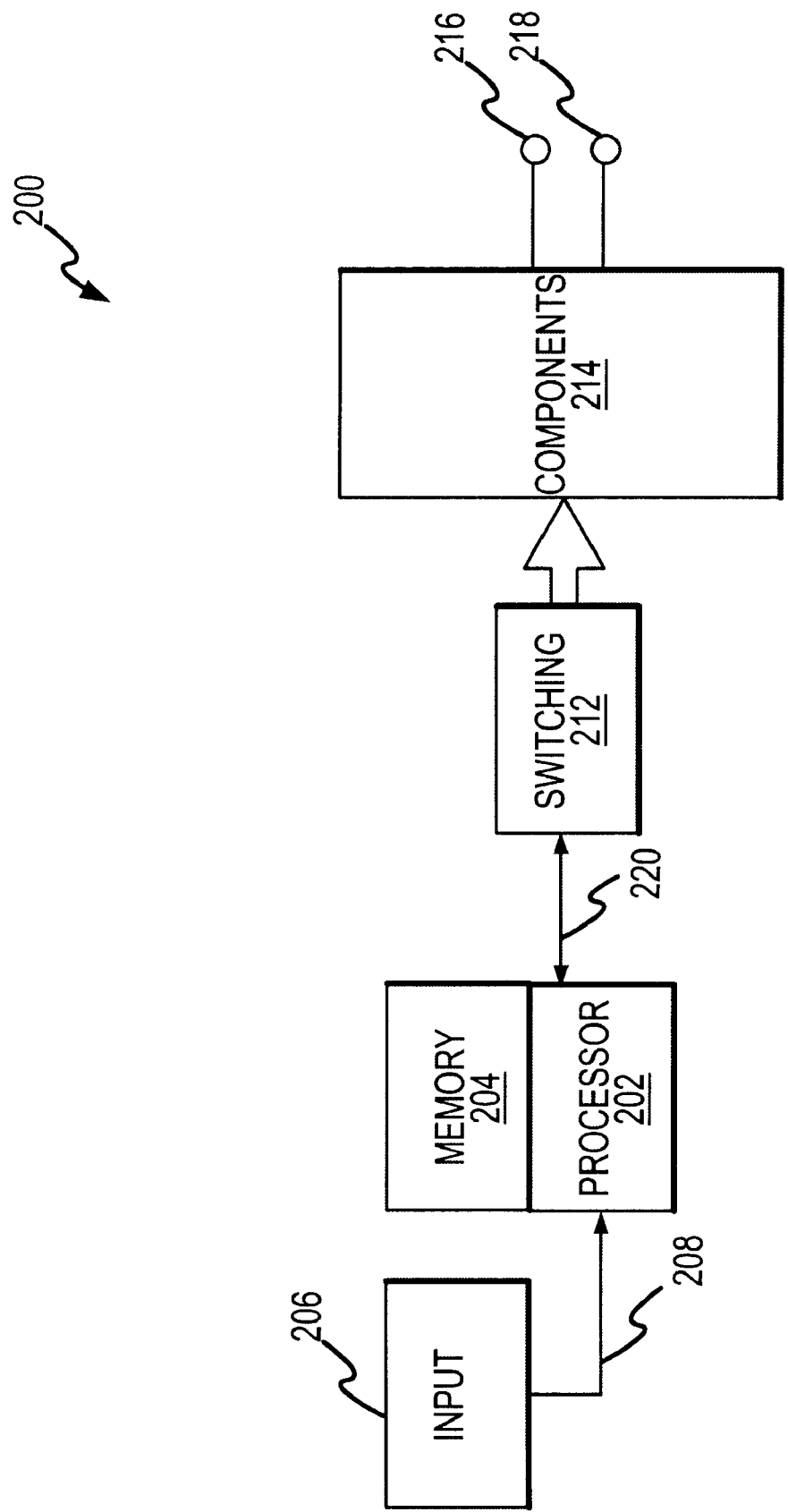

METHOD AND APPARATUS FOR CREATING A SELECTABLE ELECTRICAL CHARACTERISTIC

FIELD OF THE INVENTION

The invention relates generally to methods and apparatus for selecting and creating a desired electrical characteristic. More particularly, the invention relates to methods and devices for creating a user-definable electrical characteristic between two or more terminals.

BACKGROUND OF THE INVENTION

As electrical and electronic systems become increasing prevalent, the need for new and improved electrical/electronic test equipment also increases. Various forms of well-known test equipment found in many electronics labs include oscilloscopes, meters, voltage and current sources, and the like. A particular type of variable resistor device known as a "decade box" has been particularly common for several years. A "decade box" such as that disclosed in U.S. Pat. No. 4,227,172, (incorporated herein by reference) typically includes a number of dials or rotary switches that allow a user to select a particular resistance that is applied between two terminals. As the user rotates the switches, resistors of varying magnitudes are mechanically switched on or off as appropriate to create a desired output resistance. Conventional decade boxes typically exhibit a number of marked disadvantages, though, in that their functionality is relatively limited to selecting certain values for electrical resistance. Further, decade boxes are frequently inaccurate (especially at very low resistances) and are typically relatively expensive. Moreover, the reliability and accuracy of conventional decade boxes may degrade over time and with increasing use.

Various forms of electronic-controlled resistances are known, but none provide the advantages of the invention described herein. It is therefore desirable to create an accurate, low cost and easy-to-use method and apparatus for establishing a desired electrical characteristic (such as a resistance, capacitance, voltage, current or impedance) between two terminals.

SUMMARY OF THE INVENTION

According to various embodiments of the invention, a device having a variable output electrical characteristic includes first and second output terminals and a number of switching circuits, each switching circuit having two states. One of the states produces a first electrical effect (e.g. an increased resistance) between said first and second output terminals, and the other state produces a second electrical effect (e.g. no change in resistance) between said first and second output terminals. A processor generates control signals that are applied to the switching circuits to place the switching circuits into a desired state such that said variable output characteristic between said first and second terminals is set to a desired value, which may be input from a user.

BRIEF DESCRIPTION OF THE DRAWING FIGURES

The above and other features and advantages of the present invention are hereinafter described in the following detailed description of illustrative embodiments to be read in conjunction with the accompanying drawing figures, wherein like reference numerals are used to identify the same or similar parts in the similar views, and:

FIG. 2 is a block diagram of an exemplary electronics scheme;

DETAILED DESCRIPTION OF EXEMPLARY EMBODIMENTS

The present invention may be described herein in terms of functional block components and various processing steps. It should be appreciated that such functional blocks may be realized by any number of hardware and/or software components configured to perform the specified functions. For example, the present invention may employ various discrete or integrated circuit components, e.g., memory elements, processing elements, logic elements, look-up tables, and the like, which may carry out a variety of functions under the control of one or more microprocessors or other control devices. Similarly, the software elements of the present invention may be implemented with any programming or scripting language such as C, C++, Java, assembly language, machine language or the like, with the various algorithms being implemented with any combination of data structures, objects, processes, routines or other programming elements. Further, it should be noted that the present invention may employ any number of conventional techniques for electronics configuration, signaling, data processing and the like.

It should be appreciated that the particular implementations shown and described herein are examples of the invention and are not intended to otherwise limit the scope of the present invention in any way. Indeed, for the sake of brevity, conventional electronics, software development and other functional aspects of the systems (and components of the individual operating components of the systems) may not be described in detail herein. Furthermore, the connecting lines shown in the various figures contained herein are intended to represent exemplary functional relationships and/or physical or logical couplings between the various elements. It should be noted that many alternative or additional functional relationships, physical connections or logical connections may be present in a practical variable electrical characteristic device.

A Device with Selectable Output Characteristics

Figure 1:
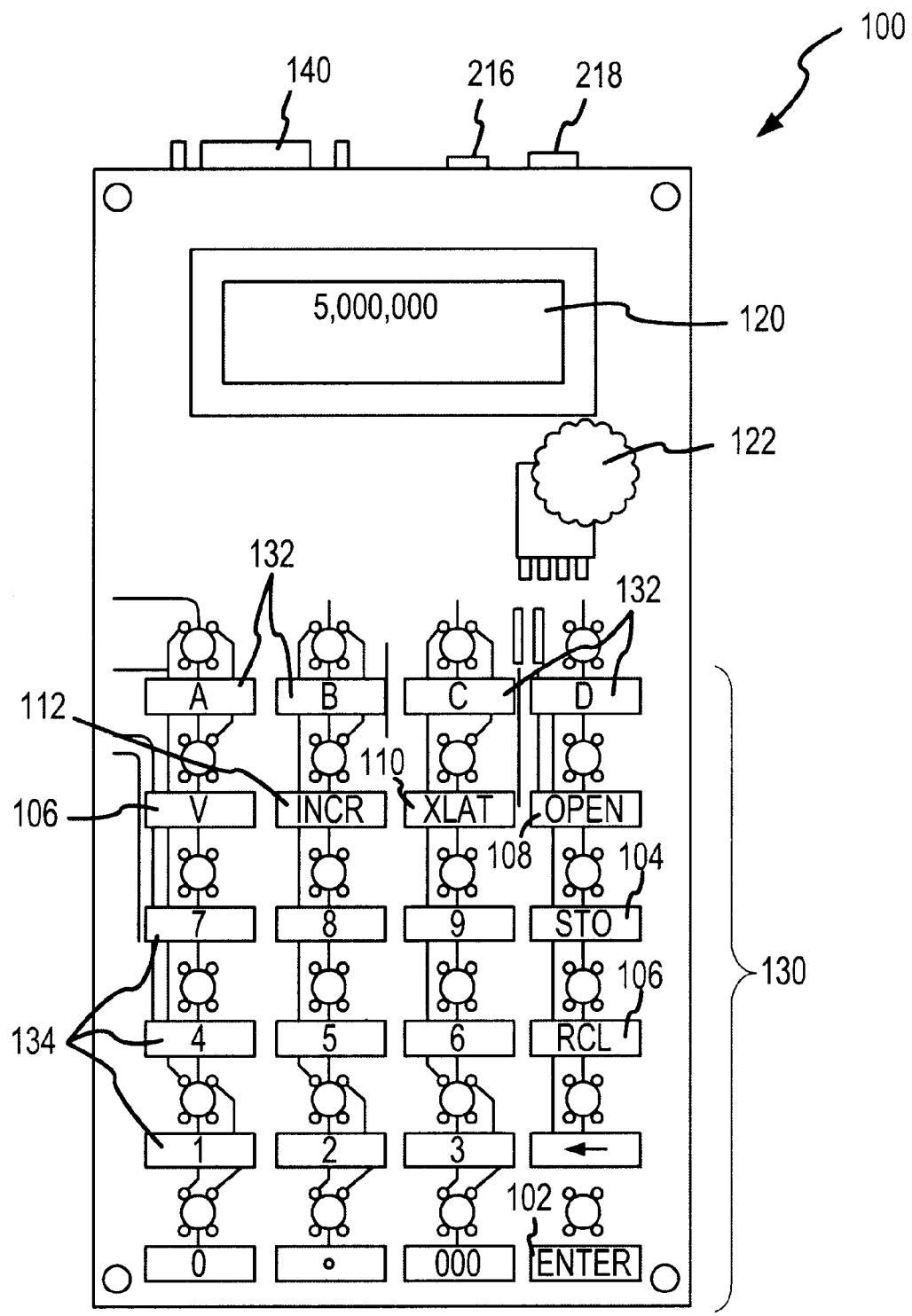
FIG. 1 is a top-down view of an exemplary device having selectable output characteristics.

With reference now to FIG. 1 an exemplary device with selectable output characteristics (DSOC) 100 having a variable output between two terminals 216 and 218 suitably includes an input device 122/130/206 and a display 120. The input device is any device such as a keyboard 130 and/or a rotary input switch 122 that is capable of receiving an input from a user. Of course, other embodiments of the invention will utilize other forms of input devices such as keypads, keyboards, touch pads, rotary devices, or direct input from an external computer. Display 120 is any type of display such as an electronic display, a Liquid Crystal Display (LCD), a display utilizing Light Emitting Diodes (LEDs), a field emitter display, a flat panel display, or any other sort of electronic, microelectronic, or other display.

To operate DSOC 100, a user provides an input via the input device. For example, a user may enter a numeric value on keypad 130 or rotate rotary dial 122 to select a desired value. In various embodiments, the desired value is entered into memory and processed when the user depresses an "ENTER" key 102. For example, if DSOC 100 is a variable resistance device, the user may enter a resistance of 5 Ohms by depressing the 5 key on keypad 130 (or selecting "5" with rotary dial 122) and subsequently pressing "ENTER" key 102. Five ohms may be displayed in display 120, and a resistance of substantially five ohms (with an acceptable tolerance, such as 0.1 ohms or 0.01 ohms) is created between the two output terminals 216 and 218, as described below. Various other embodiments of the invention produce other selectable electrical outputs such as resistances, inductances, voltages, currents, impedances, and the like through similar techniques.

DSOC 100 may, of course, be implemented with any sort of interface. In the exemplary embodiment shown in FIG. 1, a number of keys corresponding to optional features are shown. It will be appreciated that various embodiments may include different features from those described herein, and each of the features described need not be included in all embodiments of the invention. Several keys corresponding to optional features include "V" (voltage) key 106, "INCR" (increment) key 112, "STO" (store) key 104, "RCL" (recall) key 106, memory keys 132, "XLAT" (translate) key 110, and "OPEN" key 108. The optional functionalities associated with these keys are described briefly below.

In the exemplary embodiment shown in FIG. 1, a user may enter a voltage to be applied across output terminals 216 and 218 by, for example, depressing the "V" 106 and then entering a voltage. Similarly, minimum voltages, maximum voltages or other voltages, currents or other electrical affects could be entered in similar ways with similar keys. The voltage entered in such a manner could be used to prevent an excessive current from being applied across the electrical elements contained within DSOC 100, thus resulting damage to the device, as described below.

INCR key 112 allows a user to program an electrical value increment corresponding to the rotation of rotary knob 122. To set such an increment, a user may depress the "INCR" key followed by an entry of a number on the touch pad 130. Subsequent adjusting of rotary knob 122 will then adjust the value shown in display 120 by the increment previously selected. If DSOC 100 is a variable resistance device, for example, a user may select an increment of 1 Ohm by depressing "INCR" key 112, followed by the "1" key, followed by "ENTER" key. A subsequent adjustment of rotary knob 122 may then cause a value of "2" ohms to show on display 120. Similarly, increments of 5 ohms, 10 ohms, 100 ohms, or any other increment could be programmed.

In various embodiments of the invention, DSOC 100 is suitably configured to include one or more memory functions. Memory functions may utilize letter keys such as keys 132 in FIG. 1, as well as other memory locations corresponding to numerical values, or any other form of memory. To store a value (such as an input value) into memory, a user may depress "STO" button 104 followed by a letter key 132, or by any of the numerical keys 134. To recall the value associated with a memory key, a user would simply depress the appropriate letter key 132, or depress "RCL" key 106 followed by the numerical value corresponding to the stored value. The number retrieved from memory may then be shown on display 120, and may be used to create an electrical effect between the two terminals, as described herein below.

Various embodiments of the invention also include a translation function associated with the XLAT key 110. In such embodiments, DSOC 100 allows entry of one or more input values (corresponding to temperature readings, for example) that may be converted to associated electrical effects (such as resistances) by DSOC 100. In such embodiments, a user may enter a value to be translated, followed by the XLAT key 110. DSOC 100 then translates the value and generates the appropriate electrical affect between output terminals 216 and 218, as described below. Translation tables or lookup tables could be used to perform the translation required, as described below. The XLAT key could also be used to manually enter a conversion chart or lookup table. In an exemplary embodiment, a user would enter an input value, followed by XLAT key 110, followed by a corresponding value. Subsequent entries of the input value could then convert the value input to the corresponding value for the electrical characteristic between the two terminals.

In various embodiments, OPEN key 108 suitably creates an open circuit condition between output terminals 216 and 218. The open circuit may be created, for example, by opening a master switch 306 (best seen in FIG. 3B) or by any other technique. The process for opening and closing switching elements is described more fully below.

Various embodiments of DSOC 100 also include an optional interface 140 for connecting DSOC 100 to an external computer (not shown). The external computer could be used, for example, to configure and calibrate DSOC 100, to provide translation table information, to control the electrical effect across the two output terminals of DSOC 100, or for any other function. In various embodiments of the invention, interface 140 is a serial or parallel interface, such as an RS-232 interface, an IEEE 48 interface, a Firewire interface, a Uniform Serial Bus (USB) interface, or any other type of interface. Alternatively, interface 140 could be implemented as any sort of wireless interface such as an infrared or radio frequency (RF) interface Principle of Operation FIG. 2 is a block level diagram of an exemplary electronics scheme 200 suitable for use in DSOC 100. An input device 206, such as a keyboard 130, a rotary dial 122, or any other input device suitably receives an input from a user and provides a corresponding signal 208 to processor 202. Processor 202 is any sort of processor, microcontroller, microprocessor, or other programmable device such as any of the microcontroller products available from, for example, the Motorola, Intel, or Microchip Corporations. In an exemplary embodiment of the invention, processor 202 is implemented with a PIC model 16C77 microcontroller available from the Microchip Corporation of Chandler, Ariz. Processor 202 may include a memory 204 that stores, for example, commonly entered input values (as discussed above), lookup tables for executing the translation functions described above, programming instructions executed by the processor 202, and other forms of data. In other embodiments, memory 204 is not included on processor 202, but processor 202 electronically or optically communicates with an external memory 204.

Processor 202 suitably receives input signal 208 and generates a corresponding desired value for an electrical effect between output terminals 216 and 218. The desired value may correspond directly to input signal 208, or the desired value may be computed based upon a lookup table in memory 204. In the latter embodiments, processor 202 receives an input value and accesses memory 204 to retrieve a desired value corresponding to the input value. For example, if the input value is a temperature, the desired value retrieved from memory 204 may be a resistance, capacitance, or the like associated with the input value. Hence, the value of an output resistance, for example, can be modeled across a variety of temperature, pressure, or other settings. Additionally, any number of lookup tables may be stored in memory 204. For example, separate lookup tables corresponding to temperature, pressure, and the like could be stored in memory 204 such that processor 202 compensates an input value 208 for the various factors affecting the output between terminals 216 and 218. In such a manner processor 202 effectively generates a desired output value with compensation for more than one factor (e.g., temperature, pressure, and the like).

In various embodiments, a temperature sensor (not shown) such as a thermister provides a temperature signal to processor 202 so that a temperature-compensated output can be provided. In such embodiments, memory 204 suitably stores a conversion table related to temperature fluctuations in the various elements in element network 214 such that variations in the output provided between output terminals 216 and 218 due to temperature are reduced.

Processor 202 suitably generates control signals 220 that are provided to a switching network 212 in order to activate or deactivate various elements 214 in order to create the desired output between terminals 216 and 218. Control signals 220 may be generated through any technique, such as the technique disclosed in accordance with FIG. 5 herein below. Switching signals 220 are provided to switching network 212 through direct parallel connections between processor 202 and individual switches in network 212, or through a serial to parallel conversion as described below, or through any other signaling technique.

Switching network 212 suitably includes one or more switching elements for adjusting electrical components in component network 214 in response to control signals 220. Suitable switching elements include electric, electronic, or micro-electronic switches, transistors (such as Field Effect Transistors (FETs)), or relays. In various embodiments of the invention, conventional telecommunications relays may be used as switching elements in network 212. Each of the switching elements may be connected to one or more components in component network 214 such that control signals 220 activate or deactivate the switching elements in switch network 212, thus activating the components in component network 214. The actual components used in component network 214 will vary from implementation to implementation, but in various embodiments the components may be resistors, capacitors, inductors, diodes, or the like. The magnitudes of the various components may also be selected according to any scheme, such a binary scheme whereby the magnitudes of the components are selected to be substantially (within a tolerance value dependent upon the component) equal to binary multiples of a minimum resolution. For example, resistors could be selected to be 1 ohm, 2 ohms, 4 ohms, 8 ohms, 16 ohms and the like. In such an embodiment, any integer resistance from zero ohms to $2^N-1$ ohms (where N is the total number of resistors) could be created.

Alternatively, component magnitudes may be selected such that no component has a magnitude greater than the sum of the magnitudes of those components having smaller magnitudes than the component of interest (e.g. $R(N)<R(1)+R(2)+ \ldots +R(N-1)$). In an exemplary variable resistance DSOC 100 according to this scheme, resistors could be selected as 1 ohm, 1 ohm, 2 ohms, 3 ohms, 6 ohms, and the like. This scheme may be advantageous over the binary scheme for some implementations in that it this scheme less rigid (e g. components of various magnitudes are allowed) and may allow improved resolution, as described more fully below. Of course, any number of resistor/component schemes could be formulated, and any number of implementations of each scheme could be used.

As the various components in component network 214 are selectively activated or deactivated according to control signals 220 produced by processor 202, the output electrical effect between terminal 216 and terminal 218 is affected. For example, in a variable resistance DSOC 100, components in component network 214 may be resistors configured in series or parallel such that the switching on or off of individual (or groups of) resistors results in an overall resistance in accord with the desired value produced by processor 202. Similarly, variable capacitance components could be created by using capacitors as components in component network 214, variable inductance components could be used by using inductors as the components in component network 214, and the like. A variable voltage source or current source could be created through simple application of Ohm's Law. For example, a variable current source could be created by applying a known or constant voltage across terminals 216 and 218, and then varying the resistance between the terminals as described above. Similarly, a voltage source could be created by applying a known current through a variable resistance. Additionally, several banks of switching circuits may be combined such that more advanced simulations are possible, as described below in accordance with FIG. 6.

Exemplary Electronics Scheme

Figure 3A:
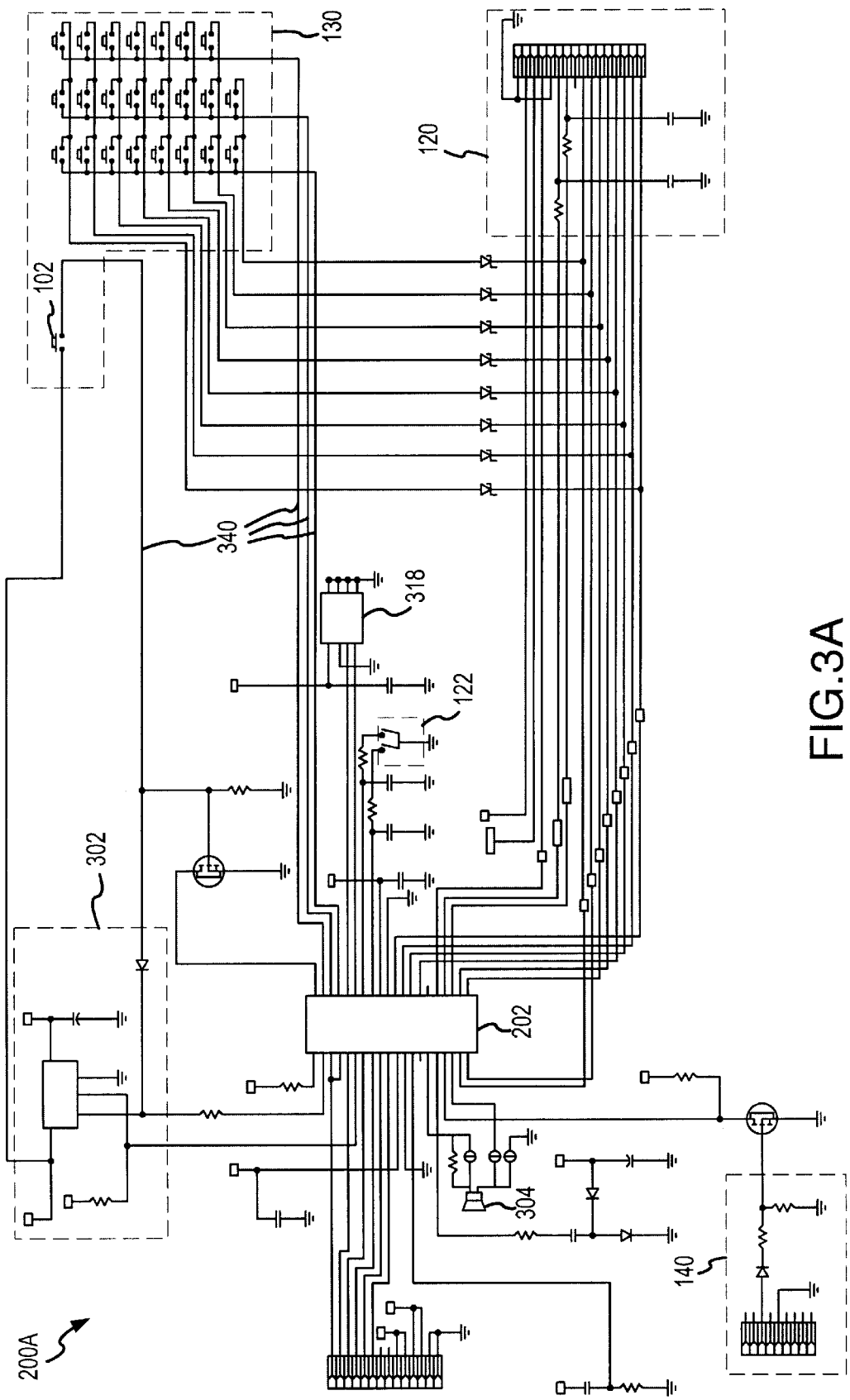
FIG. 3A is a schematic of an exemplary electronics layout.
Figure 3B:
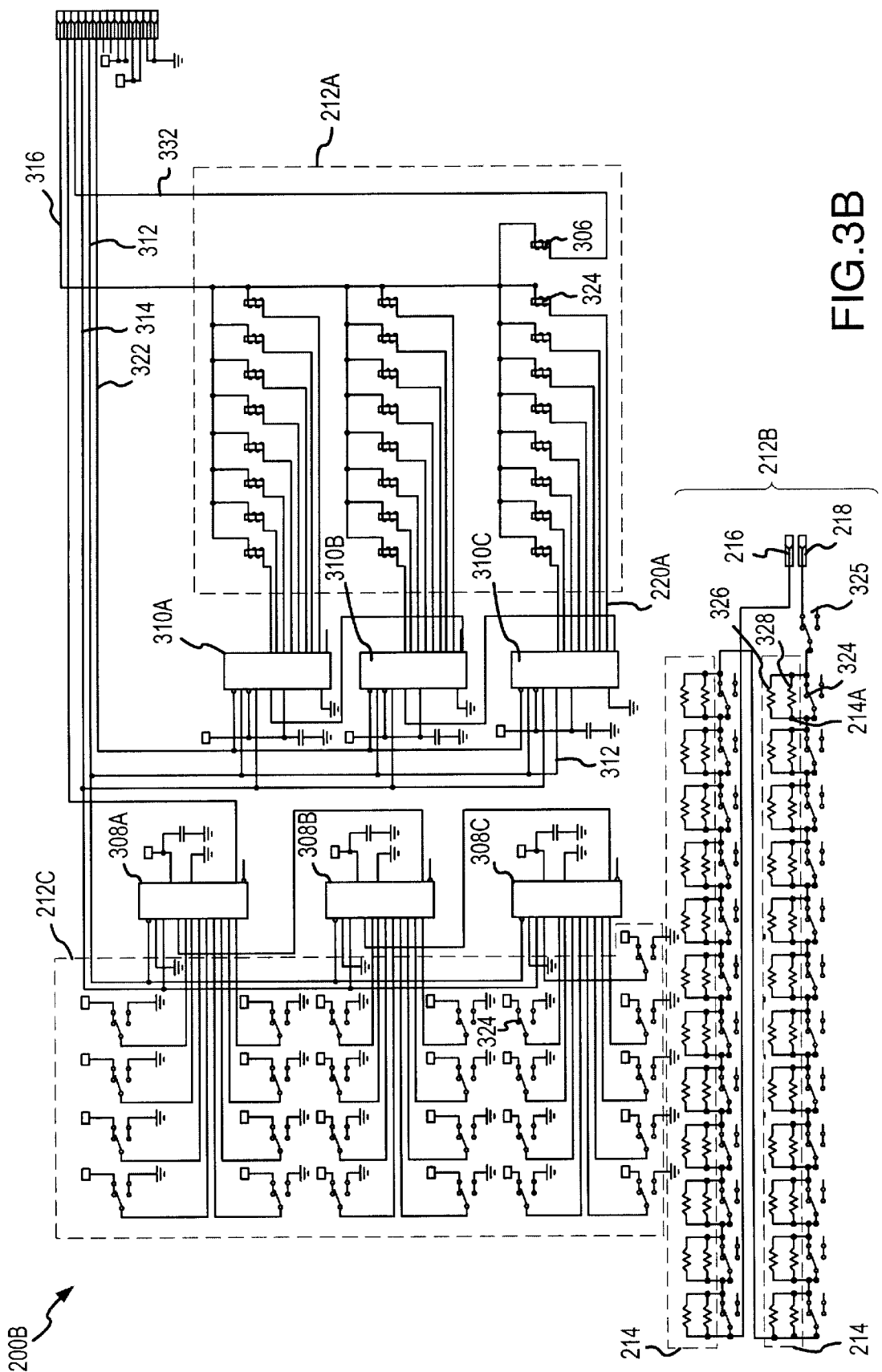
FIG. 3B is a schematic of exemplary switching and components networks.

FIGS. 3A and 3B discloses a more detailed embodiment of the electronics scheme 200 shown in FIG. 2. With reference to FIG. 3A, processor 202 is suitably connected to keyboard 130, rotary dial 122, serial interface 140, and display 120 as appropriate. An optional voltage regulator circuit 302 may also be provided to regulate the voltage of the battery or other power supply (not shown). An optional audio speaker 304 may also be connected to processor 202 to provide audio feedback for successful entry of data, incorrect data entry, error conditions or the like. An optional application-specific integrated circuit (ASIC) 318 may also be provided to store lookup table information, component values, or other data. Alternate uses of ASIC 318 may include processing of control signals, data handling, input/output (110) handling, or any other purpose. Electric power may be provided to electronics 200 by a battery, an alternating current (A/C) source, or by any other power source. In an exemplary embodiment, power is provided by a nine volt battery that may include a five volt regulator.

Processor 202 suitably accepts inputs on various signal lines from keyboard 130, rotary switch 122, or any other input device. These input signals are processed as appropriate, and various output signals are produced as described below. Of course outputs may also be provided to display 120 to provide feedback to the user as to status or operation of DSOC 100. As can be seen, signals from keyboard 130 and signals provided to display 120 may share common signal lines to and from processor 202 in various embodiments. Of course the various electronic components could be configured in a variety of ways such that the circuit operates as described herein, and the particular pin or signaling connections shown in diagrams merely illustrate an exemplary embodiment.

FIG. 3B is a block diagram of an exemplary implementation of switching network 212 and component network 214. With reference now to FIG. 33B, various embodiments suitably provide control signals 220 (FIG. 2) from processor 202 to switching network 212 as appropriate. In the exemplary embodiment shown in FIG. 3B, switching network 212 suitably includes a number of switching elements (such as the relays shown) configured to switch the various components (such as the resistors best seen in area 214) on or off in response to control signals provided from processor 202. Control signals 220 are provided to the switching elements via, for example, one or more serial-to-parallel converters 310a, 310b, 310c. Serial-to-parallel converters 310 may be any form of serial to parallel converter, such as a device number 74HC595M available from, for example, the Fairchild Semiconductor corporation of Sunnyvale, Calif., as shown in FIG. 3B. Alternatively, any sort of serial-to-parallel converter or demultiplexer circuit could be used to provide signals from processor 202 to switching network 212.

In the exemplary embodiment shown in FIG. 3B, switching network 212 is shown as including 25 three-terminal relays. Each of these relays is shown at three areas (212A, 212B and 212C) on FIG. 3B. As an example of the operation of a switching network 212, a relay 324 receives switching signal 220A that opens or closes relay 324, as appropriate, thus switching component 214A in or out of the circuit between terminals 216 and 218. Relay 324 may also include a third terminal that is used to provide information about the state of the relay, and this third terminal is best seen as relay 324 in area 212C of FIG. 3B. Of course other types of switching networks 212 and component networks 214 could be formulated. For example, various embodiments may include relays having different numbers of terminals, or different switching elements or components could be used, as described herein.

Control signals 220 may be serially provided from processor 202 to the serial to parallel converters 310 via signal line 312, for example. In the embodiment shown in FIG. 3B, signal line 312 provides control signals 220 corresponding to "open" or "close" instructions to the various switching elements in switching network 212. Signal 312 may be provided to the serial input of converter 310C, as shown, such that serial data shifted through converter 310C is provided as a serial input to converter 310B. Similarly, an output bit of converter 310B may be provided to the serial input of converter 310A, as shown, such that "bits" of serial data provided to converter 310C via signal line 312 are shifted though 24 (or any other number) of outputs. Of course, other techniques for providing serial data to the various elements in switching network 212 could also be used. For example, the switching elements could be connected in parallel to processor 202, or a second processor (such as a microcontroller or microprocessor) could receive control signals 220 from processor 202 and provide the signals to the individual switching elements in network 212. Various embodiments include an additional signal line 314 providing a clock signal to the serial to parallel converters 310 from processor 202. The clock signal may be used, for example, to latch the various control signals received from processor 202 to the individual switching elements. The clock signal may be generated at processor 202, by an external clock or crystal, or at any other source.

With continued reference to FIG. 3B, switching network 212 suitably includes one or more switching elements (such as relay 324) coupled to electric or electronic components (such as resistors 326 and 328). As described above, any type of switching elements such as FETs, microelectronic switches or relays could be used in various embodiments. The relays shown in FIG. 3B may be any sort of relays such as small-signal latch relays available from, for example, the Siemens corporation of Munich, Germany (e.g. Models V23006 or V23105). Alternatively, solid state relays could be used. In various embodiments, the relays are "three terminal" relays as shown in FIG. 3B. In such embodiments, each relay receives a control signal from processor 202 (possibly via a converter such as converters 310) at a first terminal to switch the relay between an open state and a closed state. A second terminal of each relay (shown in area 212A of FIG. 3B) may be connected to a common return signal 316 that may be provided to processor 202. In alternate embodiments, return signal 316 may be grounded or tied to a reference current or voltage. When an appropriate voltage (for example, a voltage on the order of five volts) is applied between the first and second terminals of the relay, the switch is opened or closed as appropriate. For example, relay 324 receives control signal 220A from processor 202 via converter 310C on a first terminal. If control signal 220A differs from common voltage 322 so as to indicate that the switch should be opened, then relay 324 will open, and component 214E will be switched into the circuit between output terminals 216 and 218. Although component 214E is shown in the figure as including two resistors in parallel for purposes of illustration, component 214E (and indeed all of the components in component network 214) could include any number of resistors, inductors, capacitors, diodes and the like configured in series or parallel. Moreover, each of the various components in component network 214 could be configured in a different manner to create an array of electrical characteristics between terminals 216 and 218.

Network 212C shows an optional configuration whereby the third terminal of each relay is coupled to processor 202 via a parallel-to-serial converter 308. Although not required for proper operation, this connection allows processor 202 to monitor the "open" or "closed" state of each relay. In an exemplary embodiment for providing "open" or "closed" information back to processor 202, the third terminal of each relay is coupled to a parallel input of a parallel-to-serial converter, such as a model 74HC165 available from the Fairchild Semiconductor corporation of Sunnyvale, Calif. Of course other embodiments may use other types of serial-to-parallel converters, registers, latches, flip-flops or the like to achieve similar functionality. Alternatively, the third terminals of each relay may be directly connected to processor 202 or to an intermediating processor (such as a microcontroller or microprocessor) such that information may be directly passed to processor 202. In the embodiment shown in FIG. 3B, however, converters 308 suitably receive clock signal 314 as well as signal 312 (which corresponds to control signals 220) to instruct the converters to latch the current state of the various switching elements 212. Serial data output from converter 308C may be provided as an input to converter 308B, and serial data output from converter 308B may be provided to converter 308A to provide a single serial output 320 to processor 202. Of course the number of bits provided back to processor 202 will depend upon the number of switching elements 212 used in the particular embodiment, and the various signals mays be provided to processor 202 in any number of ways. Each converter 308 may provide a separate serial output to processor 202, for example.

Various embodiments may also include a control switch 306 to act as a "master switch" for switching network 212. Control switch 306 (which may be a relay, FET or other switch as described above) suitably receives a control input 332 from processor 202 to activate or deactivate switching network 212. Control switch 306 suitably creates an open or closed circuit (as best seen in network 212B in FIG. 3B) between output terminals 216 and 218 to prevent excess currents from flowing in the circuit as relays (or other switching elements) are turned on or off In various embodiments of the invention, a limiting feature includes a voltage or current sensor that detects voltages or currents (respectively) that exceed the tolerances of DSOC 100. Any type of voltage or current sensor could be used such as a current comparator circuit coupled to a reference current. Alternatively, a voltage comparator circuit may measure a voltage applied across a precise resistance and compare the voltage observed to a known (i.e. reference) voltage. In either case, DSOC 100 could be disabled (for example by opening master relay 306 via control signal 332) when the current or voltage applied across terminals 216 and 218 exceeds the respective reference current or voltage. In still other embodiments, a differential amplifier or other device could be configured between terminals 216 and 218 to open master relay 306 if the current or voltage applied between terminals 216 and 218 exceeds a threshold level. Other embodiments may include other techniques for measuring, controlling or limiting the affects of currents and voltages applied between terminals 216 and 218.

Calibration of a DSOC

Many prior art variable output devices relied upon very accurate resistors, capacitors and the like to provide accurate results. Such devices typically suffered from parasitic effects of switches, circuit imperfections and degradations, and the like. For example, U.S. Pat. No. 5,045,832 (incorporated herein by reference) discloses a variable resistance circuit that includes a "compensating resistance value" to account for such sources of error. While compensating resistances could of course be used in various embodiments, an alternative method involves measuring the relevant electrical characteristic across each component in component network 214, and in using this actual measurement in calculating whether the particular component should be included in an output circuit between output terminals 216 and 218. By measuring the actual electrical effect produced between output terminals 216 and 218 as each component is individually switched on, any sources of error may be automatically accounted for, thus resulting in a highly accurate DSOC 100.

Figure 4:
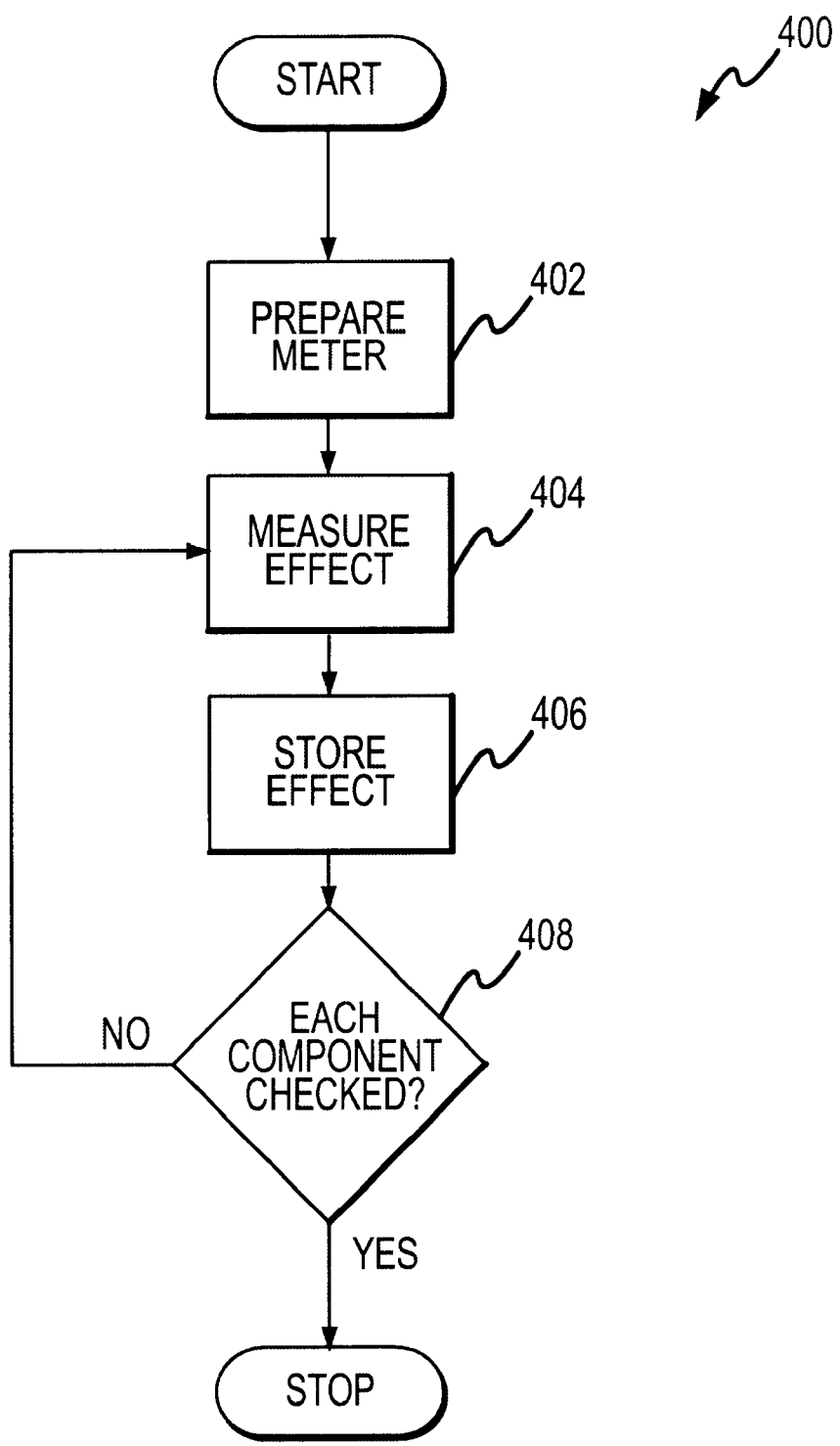
FIG. 4 is a flowchart of an exemplary configuration process for an exemplary device having selectable output characteristics.

FIG. 4 is a flowchart of an exemplary technique 400 for calibrating a variable output DSOC 100. Such a technique typically involves attaching a meter (not shown) between output terminals 216 and 218 such that the electrical effect between the terminals can be monitored. Of course the particular meter used will depend on the particular DSOC 100 being calibrated. In various embodiments, the proper meter may be an ohmmeter, an oscilloscope, a voltmeter, an ammeter, a capacitance meter or the like. The preparation and attachment of the meter to DSOC 100 is shown in FIG. 4 as step 402.

When the meter is properly attached to DSOC 100, the electrical effect observed between output terminals 216 and 218 is observed (step 404) and recorded (step 406) such that processor 202 will have access to the value observed. In various embodiments, the measurements corresponding to each component in component network 214 are stored in memory 204 for subsequent retrieval. Storage may be through any technique, such as through manual entry of values observed from the meter via keypad 130 or rotary dial 122, though computer input via interface 140, or though any other technique. In an exemplary configuration scheme, each component in component network 214 is individually activated such that its total electrical effect between output terminals 216 and 218 (including any parasitic effect, error or other effect) is observed. Each component is individually considered (step 408) such that a measurement is taken and stored for each component circuit activated by each switch in switching network 212. When measurements corresponding to the electrical effect produced by each individual switching circuit have been observed and recorded, variable effect DSOC 100 is ready for operation.

Operation of the DSOC Device

Figure 5:
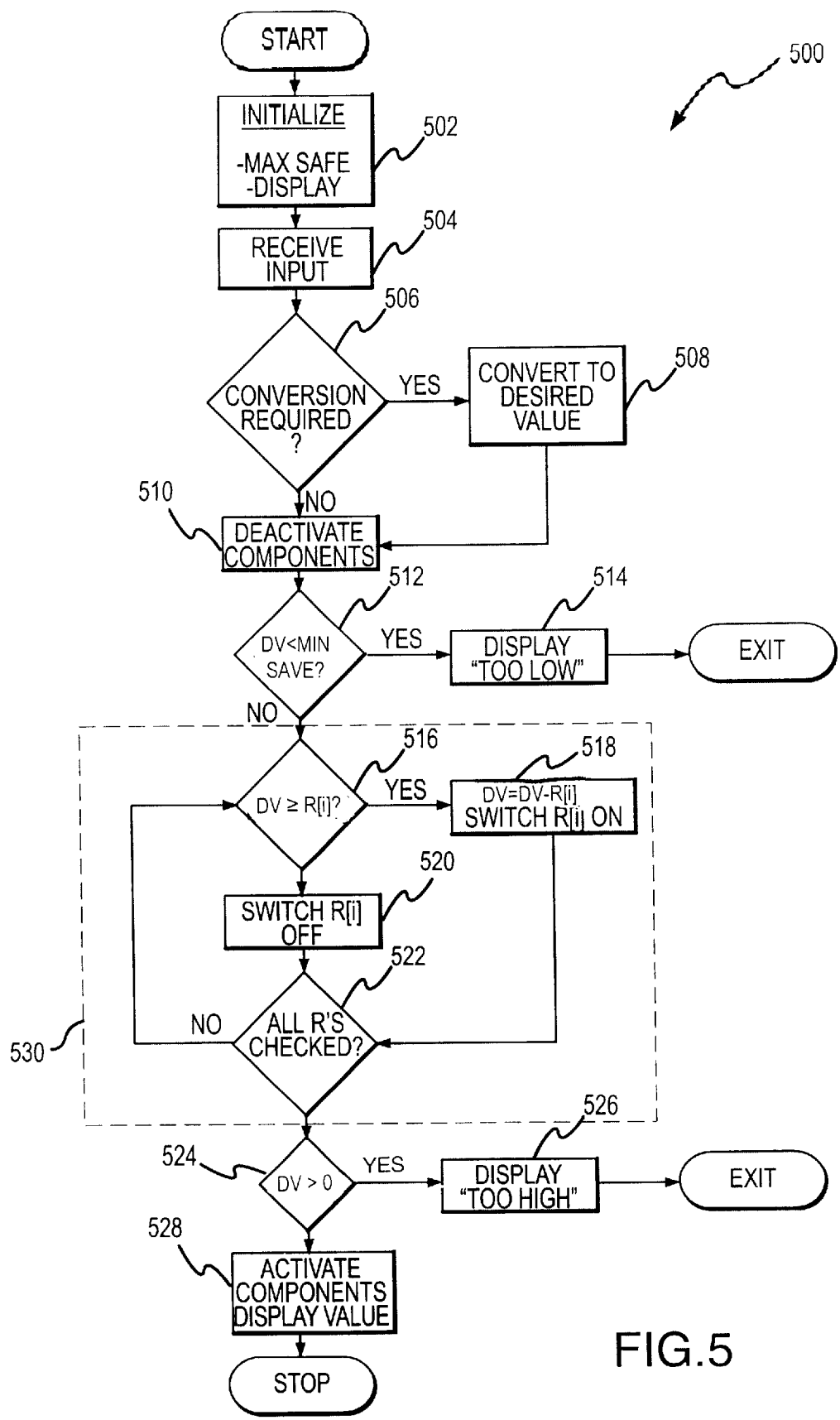
FIG. 5 is a flowchart of an exemplary operating process.

FIG. 5 is a flow chart of an exemplary technique for operating a variable output DSOC 100. To begin operation, DSOC 100 may be initialized (step 502) by placing the switching elements in switching network 212 into a known state (e.g. all open or all closed). Initialization may be achieved by, for example, transmitting a series of control signals 220 from processor 202 to each switching element such that the switch is placed into a known state. Alternatively, processor 202 could poll or otherwise determine the state of each switching element and provide control signals 220 to only those switching elements that need to change state. Other embodiments do not require that the switching elements be initialized, as discussed below.

Various embodiments may also include a calculation and check for a minimum safe resistance (or other electrical effect) based upon, for example, resistor wattage and maximum applied voltage. A maximum applied voltage may be entered by the user, for example, as described above in conjunction with "V" key 106. Given a maximum voltage applied across output terminals 216 and 218, a minimum resistance can be computed at processor 202 through simple application of Ohm's law (or through any other technique) to prevent an excessive current that may damage components in DSOC 100 or in a load circuit. Maximum current tolerances will vary from circuit to circuit, but in an exemplary embodiment the maximum current tolerated in DSOC 100 is on the order of 0.5 amperes. Initialization step 502 may also include initializing display 120. For example, display 120 may be powered up to a known state though any conventional technique, and the output presently showing between output terminals 216 and 218 may be displayed.

After optional initialization step 502 is complete, DSOC 100 is ready to receive an input from a user (step 504). The user may provide an input through any input device 206 such as keyboard 130 or rotary dial 122, or though any other device. Alternatively, an input may be received from an external computer via interface 140. In various embodiments, the relevant input device 206 accepts the input from the user and provides a corresponding input signal 208 to processor 202. With momentary reference to FIG. 3A, for example, an input signal 208 is provided to processor 202 from keyboard 130 via signal lines 340. The input signal 208 is suitably stored in processor 202 or memory 204 for further processing.

With reference again to FIG. 5, data conversion (steps 506 and 508) may be performed in various embodiments. Data conversion may be useful in converting temperature or pressure inputs to corresponding electrical outputs, for example, or for compensating the output DSOC 100 for temperature affects, as described above. If a conversion is required (step 506), processor 202 suitably obtains a desired value for the output electrical characteristic between output terminals 216 and 218 based upon the input signal received from input device 206 in step 504. The desired value may be obtained from a lookup table previously stored in memory 204, in ASIC 318 (FIG. 3A) for example, or from an external source. In an exemplary embodiment, memory 204 maintains a lookup table that contains resistances (or impedances) corresponding to various temperature inputs. A user may suitably enter a temperature as input signal 208, and processor 202 suitably converts the temperature input to a corresponding desired value for a resistance (or impedance) to be applied between output terminals 216 and 218.

Several conversions may take place during step 508 using one or more lookup tables. In various embodiments, the user may provide an input corresponding to a temperature, for example, and a second input corresponding to a pressure. Processor 202 may suitably perform two references to memory 204 to obtain two conversion factors in order to compute the proper output of DSOC 100. The calculations necessary to compute the proper desired value may be carried out through any technique, and will of course vary from embodiment to embodiment. For example, the actual desired values corresponding to particular inputs may be stored in a lookup table. Alternatively, conversion or scaling factors may be stored in the lookup table such that processor 202 obtains the conversion factor based upon input signal 208 and computes the desired value based upon input signal 208 and the conversion factor. In embodiments that do not require conversion, the desired value will be based upon input signal 208. For example, if DSOC 100 is a variable resistance device and input signal 208 corresponds to "5", the desired value may be "5 ohms".

In various embodiments, the various components in component network 214 are optionally deactivated (step 510) prior to setting the output electrical characteristic. The components may be disabled though any technique, such as by opening switching element 325 (FIG. 3B) to create an effective open circuit between output terminals 216 and 218. Switching element 325 may be opened by, for example, sending a control signal 220 to relay 306 in FIG. 3B via signal line 332. Disabling the various components prior to establishing the desired value for the output characteristic may prevent unintentional high-magnitude currents from being produced as the switching elements are selectively activated and deactivated.

Processor 202 optionally determines (step 512) whether the desired value is less than the minimum safe value computed in step 502. If the desired value is too low, processor 202 suitably provides a feedback to the user (step 514) by, for example, providing an indication on display 120 and/or by providing an audible feedback though optional speaker 304 (FIG. 3A). If the desired value is too low, the user may be prompted for another input (step 504) or the process 500 may terminate, as appropriate. Step 512 may be executed prior to step 510.

Loop 530 (which includes steps 516, 518, 520 and 522) is an exemplary technique for selectively activating and/or deactivating the various switching elements in switching network 212 to establish the desired value between output terminals 216 and 218. In the embodiment shown in FIG. 5, processor 202 cycles through the various components in component network 214 to determine if the magnitude (R[i]) of the component's electrical characteristic is less than or equal to the desired value (DV). If so (step 518), the component is switched on and a new desired value equal to the old desired value minus the magnitude of the particular component (R[i]). If the component's electrical characteristic is greater than the desired value (step 520), then the desired value is not altered and the particular component is switched off. The new desired value is then compared against the magnitude of the next component, and so on until either all components are checked (step 522) or the desired value reaches a minimum tolerance. Component magnitudes may be obtained, for example, from memory 204 or from ASIC 318, which may have received the magnitudes from the calibration technique described above in conjunction with FIG. 4. Alternatively, in the case of a "binary" arrangement of components, the magnitudes may be pre-programmed into processor 202, memory 204 or ASIC 318. The minimum tolerance varies from embodiment to embodiment, but may be approximately zero. Other embodiments may use minimum tolerances of 10 ohms, 1 ohm, 1 milliohm, or any other value. Similarly, tolerances for capacitance, voltage and the like could be created. If the desired value exceeds the tolerance after all switching elements have been considered (step 524), the original desired value may be deemed to be beyond the upper range of DSOC 100, and an appropriate feedback to the user may be provided (step 526).

The various switching elements may be activated or deactivated as appropriate, such as by generating a serial stream of control signals 220 provided to the switching elements as described above. An entire stream of serial or parallel control signals 220 corresponding to each switching element could be provided, or control signals 220 could be provided only those switching elements requiring a state change. For example, in embodiments that include initialization (step 502) into an all-open state, only those switching elements that need to be closed will require a control signal. Similarly, embodiments that are initialized to an "all open" state will require control signals only to those switching elements needing to be closed. Of course other techniques for creating the desired value could be formulated in place of loop 530.

When the proper switching elements have been activated or deactivated, as appropriate, the desired value for the output between output terminals 216 and 218 should be available. As such, the components may be activated (step 528), for example by sending a control signal 220 from processor 202 to master switching element 306 via signal line 332. Switching element 306 suitably closes switch 325 such that the circuit between the two terminals 216 and 218 is complete. The desired value may also be displayed on display 120.

Dual Devices

Figure 6:
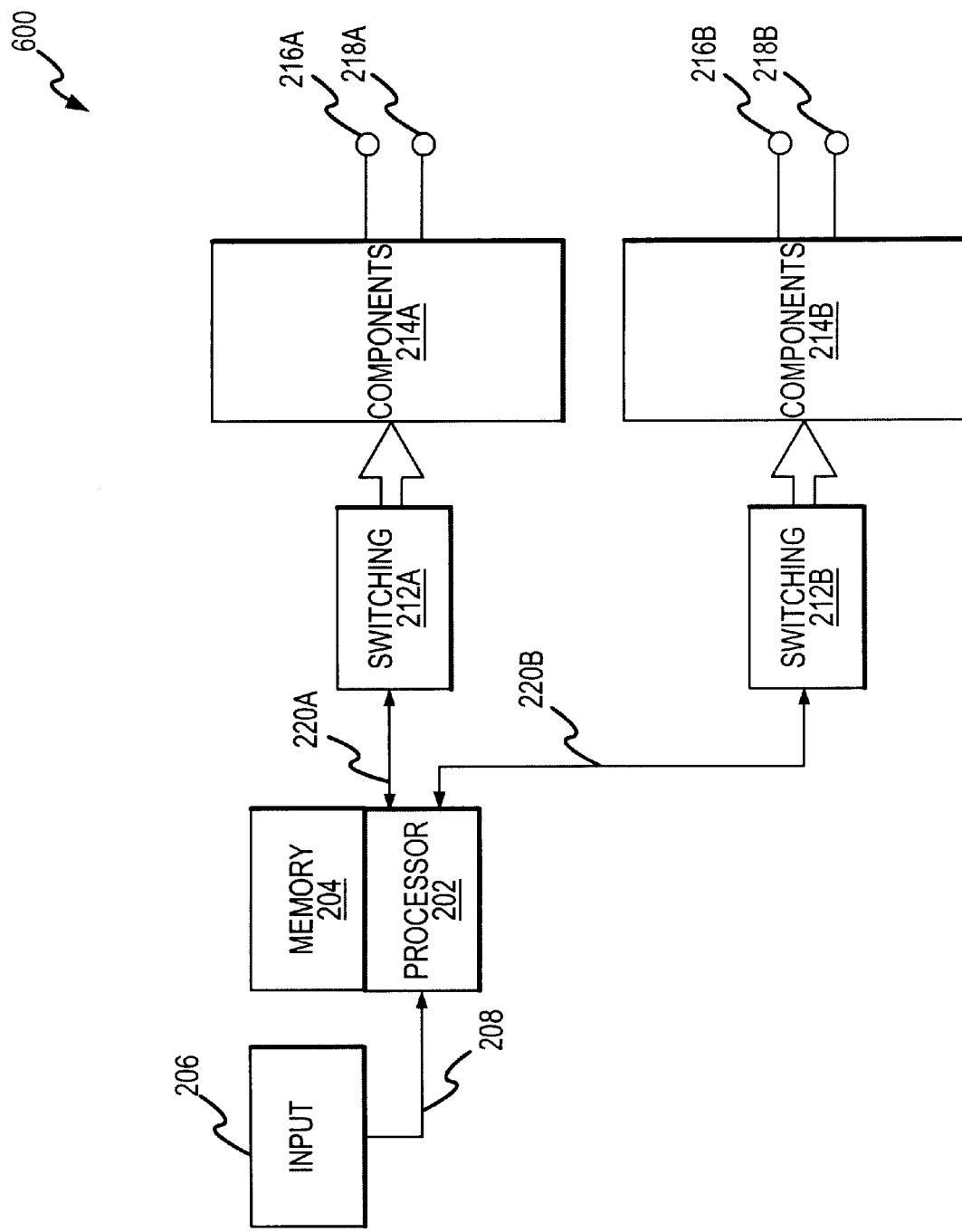
FIG. 6 is a block diagram of an exemplary device having dual outputs.

FIG. 6 is a block diagram of an exemplary dual output device 600 providing two selectable outputs, a first output between terminals 216A and 218A; and a second output between terminals 216B and 218B. A dual output device 600 suitably includes two switching networks 212A and 212B as well as two component networks 214A and 214B. As with the single output devices described above (for example in conjunction with FIG. 2), processor 202 receives an input signal 208 from an input device 206. Input signal 208 is received and processed by processor 202 to generate a first set of control signals 220A to switching network 212A and a second set of control signals 220B provided to switching network 212B. As described above, each set of control signals 220A or 220B suitably places one or more switching elements in switching network 212A or 212B (respectively) into a desired state such that a component in component network 214A or 214B (respectively) is activated or deactivated. In such a manner two output signals can be selectively controlled via input device 208 and processor 202. Of course other embodiments of dual-output device 600 could be formulated. For example, a dual device could also include a second processor (not shown) configured to receive an input from input device 206 and to generate control signals 220B. Similarly, a separate input device could also be provided such that each switching network 212A and 212B receives a separate set of control signals 220A and 220B (respectively) generated by separate processors and input devices. It will be understood that any number of switching and component networks could be configured together through similar techniques. Further, the outputs of component network 214A and component network 214B could be combined in any appropriate manner. For example, outputs could be placed in series (by connecting one of the terminals from network 214A to either of the terminals from network 214B) or in parallel (by connecting corresponding terminals from networks 214A and 214B together), or the outputs could otherwise be combined to provide a single output from device 600.

Dual devices 600 are particularly useful in simulating complex phenomena such as pH or connectivity of a solution. To simulate pH of a solution, for example, a first set of components 214A would be configured to simulate a variable resistance and a second set of components 214B would be configured to simulate a variable voltage. By varying the output resistance of component network 214A and the voltage of component network 214B, the overall output can be made to simulate pH. Connectivity can be similarly modeled using two component networks configured as variable impedances, at least one of which provides temperature compensation (via a temperature sensor, for example, or a lookup table as discussed above). Similarly, component networks providing variable resistances and capacitances can be combined to form a variable impedance device. Of course many combinations of devices could be formulated, all of which are within the scope of the present invention.

The corresponding structures, materials, acts and equivalents of all elements in the claims below are intended to include any structure, material or acts for performing the functions in combination with other claimed elements as specifically claimed. Moreover, the steps recited in any method claims may be executed in any order. The scope of the invention should be determined by the appended claims and their legal equivalents, rather than by the examples given above.

What is claimed is:

1. A portable device having a variable output electrical characteristic, the device comprising:
   an integrated input device configured to accept an input from a user corresponding to a desired value of the output electrical characteristic;
   first and second output terminals;
   a plurality of switching circuits, each switching circuit having two states, wherein one of said states produces a first electrical effect between said first and second output terminals, and wherein the other of said states produces a second electrical effect between said first and second output terminals; and
   a processor configured to generate a plurality of control signals in response to said input from said integrated input device, wherein each of said plurality of control signals is applied to a different one of said plurality of switching circuits to individually place said one of said plurality of switching circuits into one of said two states to set said variable output characteristic between said first and second terminals at the desired value.

2. The device of claim 1 wherein said input device comprises a rotary dial.

3. The device of claim 1 wherein said input device comprises a keypad.

4. The device of claim 1 further comprising a memory operatively coupled to said processor, wherein said memory is configured to store at least one value for said input.

5. The device of claim 1 further comprising a memory operatively coupled to said processor, wherein said memory is configured to provide adjustment data to said processor.

6. The device of claim 5 wherein said processor is configured to adjust said variable output electrical characteristic as a function of said input and said adjustment data.

7. The device of claim 6 wherein said memory includes a first lookup table configured to provide a first adjustment data to said processor.

8. The device of claim 7 wherein said memory includes a second lookup table configured to provide a second adjustment data to said processor.

9. The device of claim 6 further comprising a temperature sensor configured to provide a temperature signal to said processor, wherein said processor is configured to compensate said variable output electrical characteristic in response to said temperature signal.

10. The device of claim 9 wherein each of said plurality of switching circuits comprise a relay configured to switch said switching circuit between said two states in response to one of said plurality of control signals.

11. The device of claim 6 wherein each of said plurality of switching circuits comprise a relay configured to switch said switching circuit between said two states in response to one of said plurality of control signals.

12. The device of claim 1 further comprising a display operatively coupled to said processor.

13. The device of claim 12 wherein said display is a liquid crystal display.

14. The device of claim 12 further comprising an interface operatively coupled to said processor to facilitate input of data from an external computer.

15. The device of claim 14 wherein said interface is a serial interface.

16. The device of claim 14 wherein said interface is a parallel interface.

17. The device of claim 14 wherein said interface is an RS-232 interface.

18. The device of claim 14 wherein said interface is an IEEE 48 interface.

19. The device of claim 1 wherein said variable output characteristic is an electrical resistance.

20. The device of claim 1 wherein said variable output characteristic is an electrical capacitance.

21. The device of claim 1 wherein said variable output characteristic is an electrical inductance.

22. The device of claim 1 wherein said variable output characteristic is an electrical current.

23. The device of claim 1 wherein said variable output characteristic is an electrical voltage.

24. The device of claim 1 wherein each of said plurality of switching circuits comprise a relay configured to switch said switching circuit between said two states in response to one of said plurality of control signals.

25. A method of creating an electrical characteristic between two terminals in a portable device, the method comprising the steps of:
   receiving a desired value for said electrical characteristic at an integrated input device from a user;
   providing said desired value to a processor;
   generating a plurality of control signals at said processor based upon said desired value for said electrical characteristic;
   selectively activating at least one of a plurality of switching circuits in response to said plurality of control signals, each of said plurality of switching circuits having an associated electrical property to produce the desired value for said electrical characteristic between said first and second terminals.

26. The method of claim 25 wherein each of said plurality of switching circuits comprises a relay configured to switch said switching circuit between two states of said electrical property in response to one of said plurality of control signals.

27. The method of claim 26 further comprising the step of storing a plurality of measurements in a memory communicating with said processor, each of said plurality of measurements corresponding to said electrical property associated with one of said plurality of relay circuits.

28. The method of claim 26 wherein said processor communicates with a memory, said memory having stored therein a plurality of measurements, each of said plurality of measurements corresponding to said electrical property associated with of said plurality of relay circuits.

29. The method of claim 28 further comprising the step of using said processor to compute a sum of one or more of said measurements wherein said sum is substantially equal to said desired value for said electrical characteristic.

30. The method of claim 29 wherein said step of generating a plurality of control signals comprises generating control signals to activate one or more of said plurality of relay circuits corresponding to said one or more of said measurements used in computing said sum.

31. The method of claim 30 wherein the step of selectively activating at least one of said plurality of relay circuits comprises activating said one or more of said plurality of relay circuits corresponding to said one or more of said measurements used in computing said sum.

32. The method of claim 31 further comprising the step of deactivating each of said plurality of relay circuits not corresponding to said one or more of said measurements used in computing said sum.

33. The method of claim 32 wherein said processor obtains said desired value corresponding to said input from said memory.

34. The method of claim 31 wherein said input indicates a pressure.

35. The method of claim 28 wherein said processor obtains said desired value corresponding to said input from said memory.

36. The method of claim 35 wherein said input indicates a temperature.

37. A circuit having two output terminals, the circuit comprising:
an integrated input device configured to receive a first input from a user, wherein said first input corresponds to a desired value for an electrical characteristic between said two output terminals;
a first plurality of relay circuits, each relay circuit having two states wherein one of said states produces a first electrical effect upon a first output signal between said output terminals, and wherein the other of said states produces a second electrical effect upon said first output signal;
a processor configured to generate a first plurality of control signals in response to said first input, each of the first plurality of control signals being provided to a different one of said first plurality of relay circuits to individually switch said relay circuits into a circuit coupling the two output terminals to thereby produce said desired value between said two output terminals.

38. The circuit of claim 37 further comprising a first serial-to-parallel converter operatively coupled between said processor and said first plurality of relay circuits, wherein said first serial-to-parallel converter is configured to provide each of said first plurality of control signals to a different one of said first plurality of relay circuits.

39. The circuit of claim 38 further comprising a memory in communication with said processor, the memory having a first lookup table specifying a desired value of said first output signal as a function of said first input.

40. The circuit of claim 37 wherein each of said first plurality of relay circuits are operatively coupled to said processor and wherein each of said plurality of control signals are provided to a different one of said first plurality of relay circuits in parallel.

41. The circuit of claim 37 further comprising a second plurality of relay circuits, each relay circuit having two states, wherein one of said states produces a first electrical effect upon a second output signal between said output terminals, and wherein the other of said states produces a second electrical effect upon said second output signal.

42. The circuit of claim 41 wherein said input device is configured to receive a second input signal, wherein said processor is configured to generate a second plurality of control signals in response to said second input, and wherein each of the second plurality of control signals is provided to a different one of said second plurality of relay circuits to produce said second output signal corresponding to said second input.

43. The circuit of claim 42 further comprising a memory in communication with said processor, the memory having a first lookup table specifying a desired value of said first output signal as a function of said first input.

44. The circuit of claim 43 further comprising a second lookup table in said memory, the second lookup table specifying a desired value of said second output based upon said second input.

45. The circuit of claim 44 further comprising a first serial-to-parallel converter operatively coupled between said processor and said first plurality of relay circuits, wherein said first serial-to-parallel converter is configured to provide each of said first plurality of control signals to a different one of said first plurality of relay circuits.

46. The circuit of claim 45 further comprising a second serial-to-parallel converter operatively coupled between said processor and said second plurality of relay circuits, wherein said second serial-to-parallel converter is configured to provide each of said second plurality of control signals to a different one of said second plurality of relay circuits.

47. The circuit of claim 44 wherein said first output signal and said second output signal are combined to produce a desired output characteristic between said output terminals.

48. The circuit of claim 47 wherein said desired output characteristic simulates conductivity.

49. The circuit of claim 47 wherein said desired output characteristic simulates pH of a solution.

50. The circuit of claim 47 wherein said desired output characteristic simulates connectivity of a solution.

51. The circuit of claim 37 further comprising a master switch coupled to said processor wherein said master switch is configured to disable said first plurality of relay circuits when a current or voltage applied across said two output terminals exceeds a threshold level.

52. The circuit of claim 51 wherein said threshold level is a function of a current or voltage input at said input device.

53. An integrated portable device producing a desired electrical output between two output terminals in response to a corresponding user input from a user, the device comprising:
an integrated input device configured to receive the user input;

a processor configured to receive the user input from the integrated input device and to generate a plurality of control signals in response thereto; and a plurality of switching elements electrically coupled to the processor, wherein each of the switching elements is configured to receive one of the control signals from the processor and to selectively activate each of a plurality of components in response to the control signals to thereby produce an electrical characteristic between the output terminals, and wherein the electrical characteristics produced by the plurality of components are cumulative to produce the desired electrical output between the output terminals.

54. The device of claim 53 wherein the processor is further configured to activate each of the electrical components if the electrical characteristic of that component is less than a the difference between the desired electrical output and the sum of the electrical characteristics for the other activated components.

55. A user-configurable variable resistance device comprising:

an integrated input device configured to receive a desired output from a user;

a processor coupled to the integrated input device and configured to provide a plurality of control signals as a function of the desired output;

a switching network, the switching network comprising a plurality of switching elements, wherein each switching element is coupled to the processor and is operable to selectively activate and deactivate one of a plurality of resistors in response to one of the control signals;

two output terminals in an electrical circuit with the switching network, and wherein a cumulative resistance produced by the active resistors produces the desired output between the output terminals.

* * * * *